(12) United States Patent
Takemoto

(10) Patent No.: US 12,210,851 B2
(45) Date of Patent: Jan. 28, 2025

(54) STORAGE MEDIUM AND OPERATION DEVICE HANDLING AN ALTERNATIVE FLOATING-POINT FORMAT

(71) Applicants: Kabushiki Kaisha Toshiba, Tokyo (JP); Toshiba Electronic Devices & Storage Corporation, Tokyo (JP)

(72) Inventor: Takashi Takemoto, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 278 days.

(21) Appl. No.: 17/407,989

(22) Filed: Aug. 20, 2021

(65) Prior Publication Data

US 2022/0091820 A1     Mar. 24, 2022

(30) Foreign Application Priority Data

Sep. 23, 2020   (JP) ................................ 2020-158834

(51) Int. Cl.

| | | |
|---|---|---|
| G06F 7/74 | (2006.01) | |
| G06F 7/483 | (2006.01) | |
| G06F 7/487 | (2006.01) | |
| G06F 7/556 | (2006.01) | |
| H03M 7/24 | (2006.01) | |

(52) U.S. Cl.
CPC ............ *G06F 7/4876* (2013.01); *G06F 7/483* (2013.01); *G06F 7/556* (2013.01); *G06F 7/74* (2013.01); *H03M 7/24* (2013.01)

(58) Field of Classification Search
CPC ........................... G06F 7/38–575; H03M 7/24
See application file for complete search history.

(56) References Cited

U.S. PATENT DOCUMENTS

| | | | |
|---|---|---|---|
| 4,758,973 | A | 7/1988 | Ooyama et al. |
| 4,758,975 | A | 7/1988 | Omoda et al. |
| 2021/0072955 | A1* | 3/2021 | Mellempudi ........... G06F 17/16 |

FOREIGN PATENT DOCUMENTS

| | | |
|---|---|---|
| JP | 61-141033 A | 6/1986 |
| JP | 63-113726 A | 5/1988 |

(Continued)

OTHER PUBLICATIONS

M. K. Jaiswal and H. K.-H. So, "Universal number posit arithmetic generator on FPGA," 2018 Design, Automation & Test in Europe Conference & Exhibition (Date), 2018, pp. 1159-1162. (Year: 2018).*

(Continued)

*Primary Examiner* — Emily E Larocque
*Assistant Examiner* — Huy Duong
(74) *Attorney, Agent, or Firm* — Maier & Maier, PLLC

(57) ABSTRACT

A structure of floating-point number data stored in a storage medium according to an embodiment is provided with a first partial code obtained by encoding all or part of an exponent of a floating-point number using variable-length coding, and a second partial code including a significand of the floating-point number. The length of the combined code of the first partial code and the second partial code is fixed, and the end bit of the first partial code and the least significant hit of the second partial code are adjacent to each other.

16 Claims, 13 Drawing Sheets

(56) References Cited

FOREIGN PATENT DOCUMENTS

| | | |
|---|---|---|
| JP | H05-042697 B2 | 6/1993 |
| JP | 2006-318382 A | 11/2006 |

OTHER PUBLICATIONS

J. L. Gustafson, and I. T. Yonemoto, "Beating floating point at its own game: Posit arithmetic," Supercomputing frontiers and innovations 4.2 (2017), p. 71-86. (Year: 2017).*

H. F. Langroudi, V. Karia, J. L. Gustafson and D. Kudithipudi, "Adaptive Posit: Parameter aware numerical format for deep learning inference on the edge," 2020 IEEE/CVF Conference on Computer Vision and Pattern Recognition Workshops (CVPRW), Seattle, WA, USA, Jun. 2020, pp. 3123-3131. (Year: 2020).*

J. D. Murray and W. Van Ryper, Encyclopedia of Graphics File Formats, 2nd Edition, O'Reilly Media, 1996. Retrieved from fileformat.info. (Year: 1996).*

J. Johnson, "Rethinking floating point for deep learning," 2018, arXiv preprint arXiv:1811.01721, p. 1-8. (Year: 2018).*

Y. Uguen, L. Forget and F. de Dinechin, "Evaluating the Hardware Cost of the Posit Number System," 2019 29th International Conference on Field Programmable Logic and Applications (FPL), Barcelona, Spain, 2019, pp. 106-113. (Year: 2019).*

Carmichael, Z., Langroudi, H., Khazanov, C., Lillie, J., Gustafson, J., & Kudithipudi, D. (2019). Performance-efficiency trade-off of low-precision numerical formats in deep neural networks. In Proceedings of the conference for next generation arithmetic 2019 (pp. 1-9). (Year: 2019).*

J. Savard, "Floating-Point Formats," John Savard's Home Page, n.d., pp. 1-13. Accessible at quadibloc.com/comp/cp0201.htm. Retrieved from an archive.org Wayback Machine snapshot from Jan. 2, 2019. (Year: 2019).* a, "IEEE Standard for Floating-Point Arithmetic," in IEEE Std 754-2019 (Revision of IEEE 754-2008), vol. no., pp. 1-84, Jul. 22, 2019. (Year: 2019).*

* cited by examiner

| REGIME VALUE (K) | REGIME CODE | REGIME CODE LENGTH (L) |
|---|---|---|
| ⋮ | ⋮ | ⋮ |
| 3 | 11110 | 5 |
| 2 | 1110 | 4 |
| 1 | 110 | 3 |
| 0 | 10 | 2 |
| −1 | 01 | 2 |
| −2 | 001 | 3 |
| −3 | 0001 | 4 |
| −4 | 00001 | 5 |
| ⋮ | ⋮ | ⋮ |

| REGIME VALUE (K) | REGIME CODE | REGIME CODE LENGTH (L) |
|---|---|---|
| ⋮ | ⋮ | ⋮ |
| 3 | 00001 | 5 |
| 2 | 0001 | 4 |
| 1 | 001 | 3 |
| 0 | 01 | 2 |
| −1 | 11 | 2 |
| −2 | 101 | 3 |
| −3 | 1001 | 4 |
| −4 | 10001 | 5 |
| ⋮ | ⋮ | ⋮ |

| VALUE OF LOW n-m-2 BITS | OFFSET TO EXPONENT | |
|---|---|---|
| | CASE OF ORDINARY DENORMAL NUMBER | CASE OF THIRD EMBODIMENT |
| 1xxxxxx⋯⋯⋯ | NORMAL NUMBER IN IEEE | $(-1)^r \times M \times r$ |
| 01xxxxx⋯⋯⋯ | -1 | $(-1)^r \times M \times (r+1)$ |
| 001xxxx⋯⋯⋯ | -2 | $(-1)^r \times M \times (r+2)$ |
| ⋮ | ⋮ | ⋮ |
| 0000000⋯⋯01x | -(n-m-4) | $(-1)^r \times M \times (r+(n-m-4))$ |
| 0000000⋯⋯001 | -(n-m-3) | $(-1)^r \times M \times (r+(n-m-3))$ |

| OFFSET TO EXPONENT | SIGNIFICAND PART | |
|---|---|---|
| | CASE OF ORDINARY DENORMAL NUMBER | CASE OF FOURTH EMBODIMENT |
| 0 | 1xxxxxx·······xxxxxx | xxxxxxx·······xxxxx1 |
| -1 | 01xxxxx·······xxxxxx | xxxxxxx·······xxxx10 |
| -2 | 001xxxx·······xxxxxx | xxxxxxx·······xxx100 |
| ⋮ | ⋮ | ⋮ |
| -(n-m-3) | 0000000·······00001x | x10000·······000000 |
| -(n-m-2) | 0000000·······000001 | 100000·······000000 |

STORAGE MEDIUM AND OPERATION DEVICE HANDLING AN ALTERNATIVE FLOATING-POINT FORMAT

CROSS-REFERENCE TO RELATED APPLICATIONS

This application is based upon and claims the benefit of priority from the prior Japanese Patent Application No. 2020-158834 filed in Japan on Sep. 23, 2020; the entire contents of which are incorporated herein by reference.

FIELD

Embodiments herein relate to a storage medium and an operation device.

BACKGROUND

Floating-point numbers in a typical format such as IEEE 754 contain three parts, namely a sign part, an exponent part, and a significand part, and a code length of each part is fixed. On the other hand, a floating-point number format known as Posit having an extended exponent part encoded by variable-length coding has been proposed recently.

In Posit, a code length of entire numerical representation remains fixed but the number of bits needed to represent an exponent is variable, and accordingly the number of bits in the significand part is also variable. Compared to floating-point numbers in a typical format, Posit floating-point numbers are capable of securing larger dynamic range while also providing high accuracy with numerical values having an absolute value close to 1.0. Applying Posit floating-point numbers to processing by deep neural networks for example has been confirmed to yield accurate processing results with smaller data sizes.

However, compared to operation devices that support typical floating-point formats, operation devices that support Posit are much larger in circuit scale and have much higher power consumption.

DETAILED DESCRIPTION

A storage medium according to an embodiment is a non-transitory computer readable storage medium that stores data having a data structure of floating-point numbers. The data structure of floating-point numbers is provided with a first partial code obtained by encoding all or part of an exponent of a floating-point number using variable-length coding, and a second partial code including a significand of the floating-point number. A length of a combined code of the first partial code and the second partial code is fixed, and an end bit of the first partial code and a least significant bit of the second partial code are adjacent to each other.

Hereinafter, embodiments will be described with reference to the drawings.

First Embodiment

Figures 1, 2:
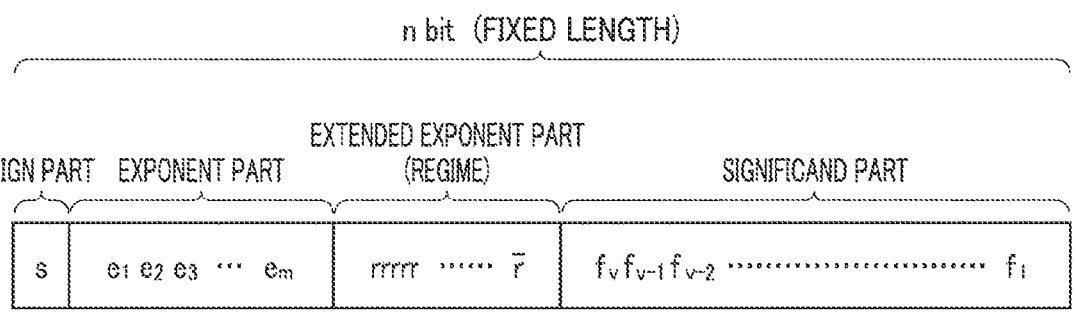
FIG. 1 is a diagram illustrating a data structure of a floating-point number according to a first embodiment.
FIG. 2 is a table illustrating an example of variable-length coding rules for an extended exponent part according to the first embodiment.

FIG. 1 is a diagram illustrating a data structure of a floating-point number according to a first embodiment. A floating-point number according to the first embodiment has a fixed length of n bits (where n is a positive integer). A floating-point number according to the first embodiment contains a sign part (sign), an exponent part, an extended exponent part (regime) (first partial code), and a significand part (second partial code) in the above order.

The sign part has a fixed length of 1 bit, and stores a bit value s indicating the sign of the floating-point number. For the bit value s, 0 denotes a positive (+) sign, and 1 denotes a negative (−) sign.

The exponent part has a fixed length of m bits (where in is an integer equal to or greater than 1). In FIG. 1, the bit value of the exponent part is expressed $e_1, e_2, e_3, \ldots, e_m$.

The extended exponent part has a variable length of 2 or more bits, and stores a regime. The bit value stored in the extended exponent part is an exponent offset coefficient referred to as a regime. The regime is encoded according to variable-length coding rules. In FIG. 1, the bit value of the regime is expressed r, r, r, . . . , /r.

The floating-point data structure in FIG. 1 has the following merits. 1) Even if a code length L of the regime changes, a correspondence between a digit and a bit position of the significand part does not change. 2) Even if the code length L of the regime changes, a bit position of the exponent part does not change. 3) If a bit range corresponding to the extended exponent part (invalid digits) is masked, low (n−m−3) bits of the floating-point number can be considered to be a significand part of fixed length.

Let L, be a code length of the extended exponent part (where L is an integer equal to or greater than 2). FIG. 2 is a table illustrating an example of variable-length coding rules for the extended exponent part according to the first embodiment, and is identical to a Posit format. The variable-length coding rules are based on unary coding, which is a type of variable-length code expressing positive integers, but expands unary coding to also express negative numbers. A general property of variable-length codes is that although decoding from the beginning of the code possible, decoding from an end part is impossible because the code length L cannot be specified.

A leading bit of the extended exponent part is a flag r expressing whether a regime value K is positive or negative. The regime value K is a value obtained by decoding the regime according to the variable-length coding rules in FIG. 2. The regime value K is positive when r=1 and negative when r=0. With respect to the flag r, in a case where r=1, a number of r equal to an absolute value of the regime value K follows, and in a case where r=0, a number of r equal to an absolute value of the regime K minus 1 follows. Furthermore, /r indicating the end part is added to a trailing bit. Here, /r is a bit value different from r, such that /r=0 when r=1 and /r=1 when r=0.

The significand part has a variable length. Because an entire floating-point number has a fixed length of n bits, the code length of the significand part varies depending on the code length L of the extended exponent part, and is (n−m−L−1). A numerical value expressed in a floating-point number format according to the present embodiment is expressed using the regime value K according to Expression (1).

$$(-1)^s \times 2^{(M \times K + e)} \times 1.f_1 f_2 f_3 \ldots f_v \quad (1)$$

where M is given by the following Equation (1a).

$$M = 2^m \quad (1a)$$

(Configuration)

Figure 3:
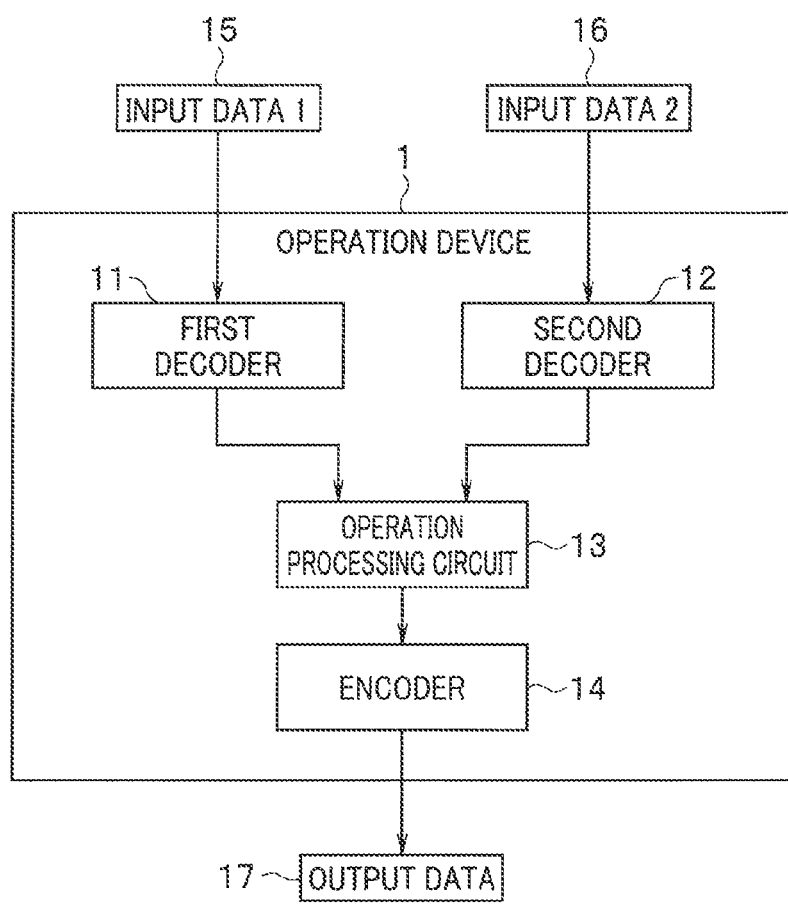
FIG. 3 is a block diagram illustrating an example of a basic configuration of an operation device according to the first embodiment.

FIG. 3 is a block diagram illustrating an example of a basic configuration of an operation device according to the first embodiment. An operation device 1 is a computer that accepts input data 1 stored in a storage medium 15 and input data 2 stored in a storage medium 16 as input, performs a predetermined operation, and outputs an operation result as output data to be stored in a storage medium 17. The input data 1, the input data 2, and the output data are n-bit floating-point numbers as illustrated in FIG. 1. The storage media 15, 16, and 17 are non-transitory computer readable storage media that store data having a data structure of floating-point numbers. The storage media 15, 16, and 17 may be separate storage media or the same storage medium. The operation device 1 is provided with a first decoder 11, a second decoder 12, an operation processing circuit 13, and an encoder 14. The input data 1 and 2 are floating-point numbers encoded in the floating-point format according to the present embodiment.

The first decoder 11 decodes and converts the input data 1 to output a numerical value in an ordinary floating-point number format such as the IEEE 754 format. The ordinary floating-point number format (hereinafter abbreviated to the ordinary format) refers to a format in which a correspondence relationship between a digit position and a bit position of the exponent and the significand in a floating-point number is fixed, excluding denormal numbers.

The second decoder 12 decodes and converts the input data 2 to output a floating-point number in the ordinary format.

The operation processing circuit 13 performs a predetermined operation on the floating-point number inputted from the first decoder 11 and the floating-point number inputted from the second decoder 12, and outputs a floating-point number in the ordinary format as the operation result.

The encoder 14 encodes and converts the operation result inputted from the operation processing circuit 13 to output a floating-point number in the same format as the input data 1 and the input data 2.

Figure 4:
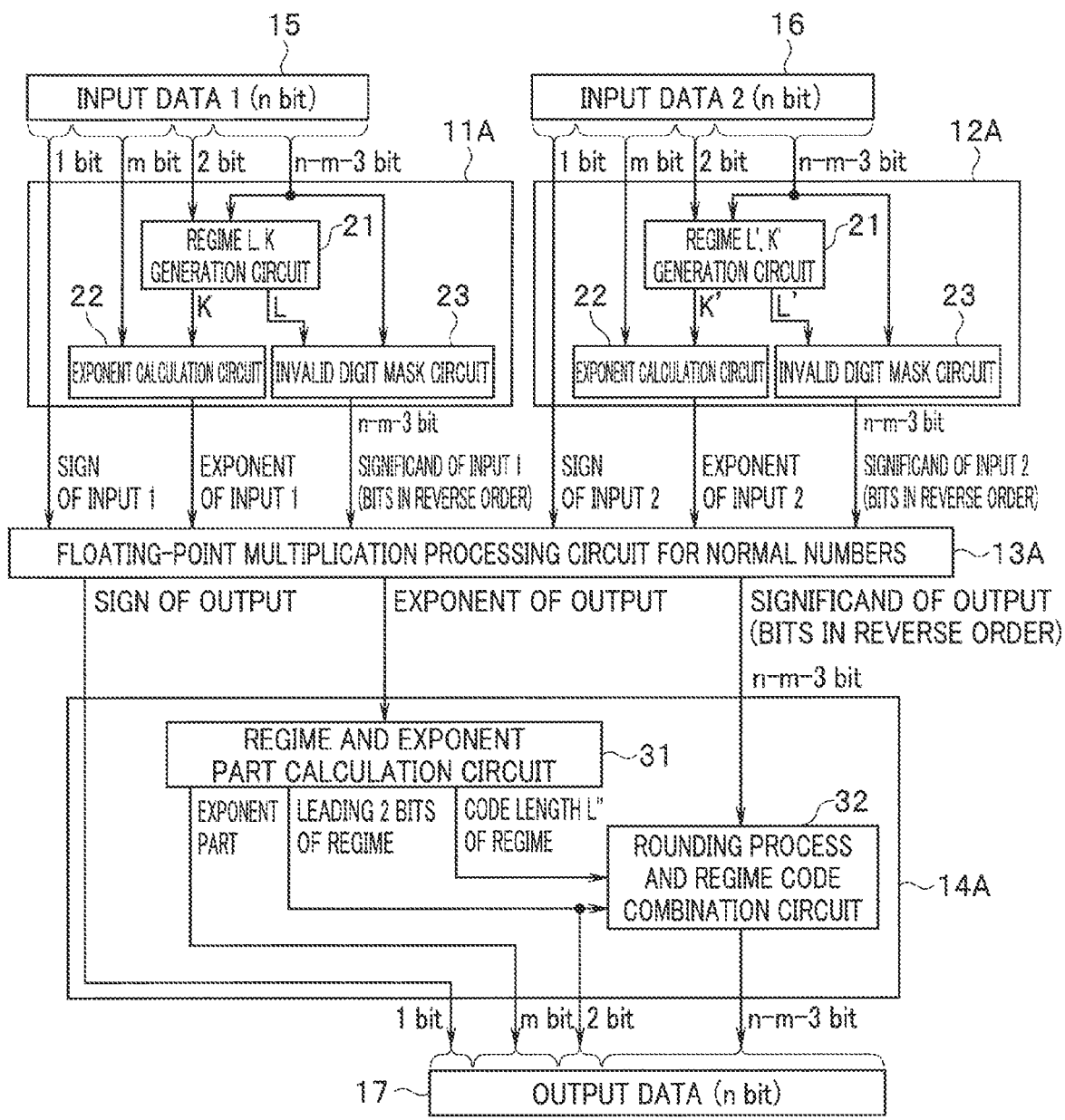
FIG. 4 is a block diagram illustrating an example of a specific configuration of an operation device according to the first embodiment.

FIG. 4 is a block diagram illustrating an example of a specific configuration of an operation device according to the present embodiment. The operation device in FIG. 4 is provided with a first decoder 11A, a second decoder 12A, an operation processing circuit 13A, and an encoder 14A.

The first decoder 11A and the second decoder 12A have the same configuration, and internal circuits of each are denoted with the same reference numerals. Only the first decoder 11A is described, and a description of the second decoder 12A is omitted.

The first decoder 11A is provided with an LK generation circuit 21, an exponent calculation circuit 22, and an invalid digit mask circuit 23 (hereinafter abbreviated to the mask circuit 23). Note that the code length and value K' of the regime handled by the second decoder 12A are denoted by a prime symbol, and the code length L" of the regime handled by the encoder 14A is denoted by a double prime symbol.

The leading bit acting as the sign part of the input data 1 is outputted to the operation processing circuit 13A through the first decoder 11A.

The LK generation circuit 21 receives the low (n-m-1) bits of the input data 1 excluding the sign part and the exponent part, and generates the code length L and value K of the regime according to the variable-length coding rules in FIG. 2.

The exponent calculation circuit 22 calculates the exponent (M×K+e) of the floating-point number in the ordinary format on a basis of the value e of the m-bit exponent part in the input data 1 and the value K received from the LK generation circuit 21, and outputs the calculated exponent to the operation processing circuit 13A.

The mask circuit 23 receives the low (n-m-3) bits of the input data 1, masks the invalid digits (the high (L−2) bit range corresponding to the extended exponent part) on a basis of the code length L received from the LK generation circuit 21, and outputs a significand with the bits in reverse order to the operation processing circuit 13A.

The operation processing circuit 13A multiplies the floating-point numbers inputted from the first and second decoders 11A and 12A, and outputs the multiplication result to the encoder 14A. Note that the floating-point numbers inputted into and outputted from the operation processing circuit 13A are in the ordinary format, but differ from the IEEE 754 format and the like by having the significand bits in reverse order.

The encoder 14A is provided with a circuit 31 that calculates the regime and the exponent part (hereinafter abbreviated to the calculation circuit 31) and a circuit 32 that performs a rounding process and combines the regime code (hereinafter abbreviated to the combination circuit 32). The encoder 14A treats the leading bit of the data received from the operation processing circuit 13A as the leading bit of the output data.

The calculation circuit 31 receives the exponent of the operation result from the operation processing circuit 13A, and outputs the data of the low m bits as the exponent part. The calculation circuit 31 encodes the data of the remaining high bits according to the variable-length coding rules. The calculation circuit 31 outputs the high 2 bits of the encoded data as the high 2 bits of the regime code in the output data. The calculation circuit 31 outputs the data of the high 2 bits of the regime and the code length L" of the regime to the combination circuit 32.

The combination circuit 32 receives the significand (n-m-3) bits of the operation result from the operation processing circuit 13A, and receives the data of the high 2 bits and the code length L" of the regime from the calculation circuit 31. The combination circuit 32 performs a process of rounding (such as rounding up at 5) a digit of the received significand to be overwritten by the bit pattern of the regime code if necessary (for example, when L" is 3 or greater). The combination circuit 32 generates data of the low (L"-2) bits of the regime code on a basis of the received data of the high 2 bits and the code length L" of the regime. The combination circuit 32 combines the generated data of the low (L"-2) bits with the rounded data of the significand part, and outputs the combined result as the low (n-m-3) bits of the output data.

The n-bit output data illustrated in FIG. 1, including the 1 bit of the sign part received from the operation processing circuit 13A, the m bits of the exponent part and the high 2 bits of the regime outputted from the calculation circuit 31, and the low (n-m-3) bits outputted from the combination circuit 32, is outputted from the encoder 14A.

Comparison of Present Embodiment and Comparative Example

Figure 17:
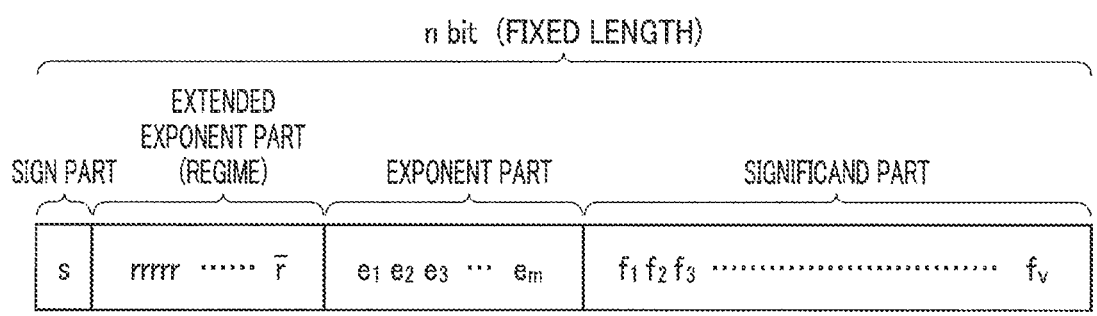
FIG. 17 is a diagram illustrating a typical data structure of a floating-point number in Posit format according to a comparative example.

FIG. 17 is a diagram illustrating a typical data structure of a floating-point number in Posit format according to a comparative example, A floating-point number in Posit format has a fixed length of n bits. A floating-point number in Posit format contains a sign part, an extended exponent part, an exponent part, and a significand part in the above order.

FIGS. 1 and 17 differ from each other as follows. 1) A bit array of the significand part is in reverse order. 2) The exponent part and the extended exponent part have switched places.

With a decoder in Posit format, it is necessary to obtain the code length L of the regime and then shift the data (L−2) bits to the left according to the bit position of the exponent part and the significand part. Because an amount of left shift is different depending on the code length L, wiring of the circuit is complex. Also, with an encoder in Posit format, it is necessary to obtain the code length L" of the regime and then arithmetically shift the data (L"−2) bits to the right according to the code length L". Because an amount of arithmetic right shift is different depending on the code length L", the wiring of the circuit is complex.

In an ordinary floating-point multiplication process corresponding to normal numbers, the significand and the exponent can be processed separately, and consequently the significand multiplication process tends to become a critical path (longest path) from a timing perspective. On the other hand, in Posit, the processes of "generating the code length L of the regime" and "shifting the data (L−2) bits to the left" are sequentially connected before the significand multiplication process and the process of "arithmetically shifting the data (L"-2) bits to the right" is sequentially connected after the significand multiplication process, and the critical path is extended.

Consequently, in a case of an operation device supporting Posit, it is necessary to increase the number of pipeline stages to maintain operation performance without inducing a stall. Also, if the two decoders on an input side and the encoder on an output side are taken together, a wide bitwise shift circuit with complex wiring becomes necessary in three places. Given these factors, a floating-point operation device supporting Posit is large in circuit scale and has higher power consumption compared to an ordinary floating-point operation device, and generally, has higher (double or more, for example) circuit costs.

In contrast, by using the data structure illustrated in FIG. 1, the correspondence between the digit position and the bit position of the significand part is fixed. Consequently, according to the first embodiment, the significand can be generated by simply extracting the low (n-m-3) bits of the input data and applying a mask (invalid digit mask) to the bits corresponding to the extending exponent part. In other words, a procedure of using a shift process to generate the significand according to the regime code length that is necessary in Posit is made unnecessary in the present embodiment.

Also, in the present embodiment, a shift process is also unnecessary for generating the significand part of the output data, and it is sufficient to simply combine the bit pattern of the code from the regime code length L" with the significand. Consequently, the circuit scale and power consumption of the operation processing circuit in FIG. 4 can be reduced compared to a Posit operation processing circuit.

Furthermore, because the bit position of the exponent part does not change even if the regime code length L changes, the exponent part can be extracted easily from a floating-point number having the data structure of FIG. 1.

Modification of First Embodiment

Figures 5, 6:
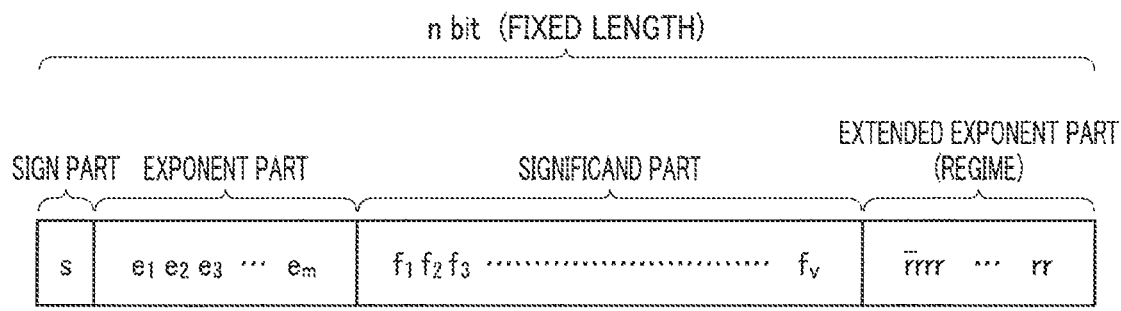
FIG. 5 is a diagram illustrating a data structure of a floating-point number according to a modification of the first embodiment.
FIG. 6 is a table illustrating an example of variable-length coding rules for an extended exponent part according to a second embodiment.

FIG. 5 is a diagram illustrating a data structure of a floating-point number according to a modification of the first embodiment. FIGS. 1 and 5 differ from each other as follows. 1) The significand part and the extended exponent part have switched places. 2) The bit array of the significand part is in forward order, and the bit array of the extended exponent part is in reverse order.

A necessary condition for the data structure of a floating-point number according to the present embodiment is that the least significant bit $f_v$ of the significand part and the end bit /r of the variable-length code of the extended exponent part are adjacent to each other. If this configuration is satisfied, either the extended exponent part or the significand part may be placed on a more significant side inside a set of the adjacent extended exponent part and the significand part. Furthermore, the three parts of the sign part, the exponent part, and the set of the extended exponent part and the significand part may be arranged in any order. Consequently, in both of the data structures illustrated in FIGS. 1 and 5, the sign part and the exponent part may also be placed on a less significant side (right side) of the significand part and the extended exponent part.

Also, the variable-length coding rules for the extended exponent part are not limited those illustrated in FIG. 2, and may be any rules. Furthermore, although Expression (1) illustrates an example in which the exponent is denoted (M×K+e), the exponent is not limited to the above and may be expressed by any function using e and K. Also, although an example in which exponent information is partially encoded by variable-length coding is described, entire exponent information may also be encoded by variable-length coding.

Second Embodiment

Figure 7:
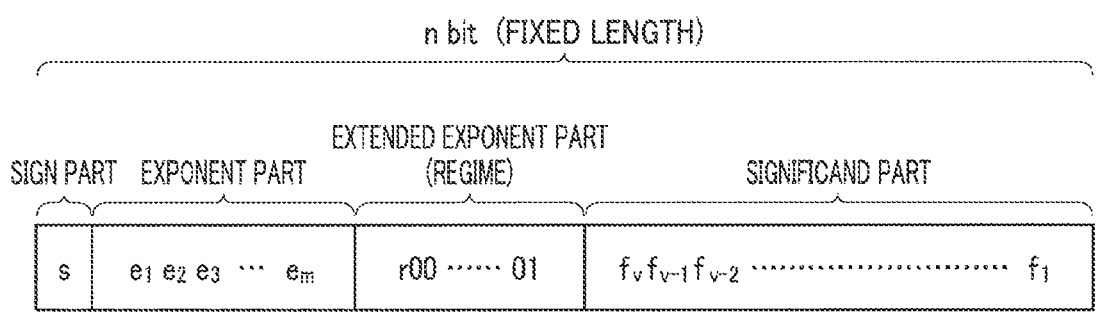
FIG. 7 is a diagram illustrating a data structure of a floating-point number according to the second embodiment.

In a second embodiment, portions that differ from the first embodiment will be described mainly. In the first embodiment, the process of shifting the significand part and the exponent part is unnecessary, but the process of masking the invalid digits is necessary. In contrast, in the second embodiment, the processing of masking the invalid digits is also unnecessary. FIG. 6 is a table illustrating an example of variable-length coding rules for the extended exponent part of a floating-point number according to the second embodiment. FIG. 7 is a diagram illustrating a data structure of the floating-point number according to the second embodiment.

According to the rules illustrated in FIG. 6, the flag r expressing whether the regime is positive or negative is followed by a number of successive 0s related to the absolute value of the regime. First, according to the rules in FIG. 6, the regime value K is denoted as positive by r=0 and as negative by r=1. However, the value of the flag r may also be the same as the example in FIG. 2. The number of successive 0s following the flag r is equal to the absolute value of the regime value K in a case where r=0, and is equal to the absolute value of the regime value K minus 1 in a case where r=1. Furthermore, an end bit with a value of 1 is added after the successive 0s.

Additionally, a numerical value expressed by the present embodiment is represented by Expression (2), where M in Expression (2) is given by Equation (1a).

$$(-1)^s \times 2^{(M \times K+e)} \times 1.f_1 f_2 f_3 \ldots f_v 1 \qquad (2)$$

When converting a desired numerical value to be expressed into a floating-point format with the closest value, normally the digits smaller than the least significant bit $f_v$ of the significand part are rounded up or rounded down. In contrast, Expression (2) means that the bits of the digits smaller than $f_v$ can simply be discarded.

Figure 8:
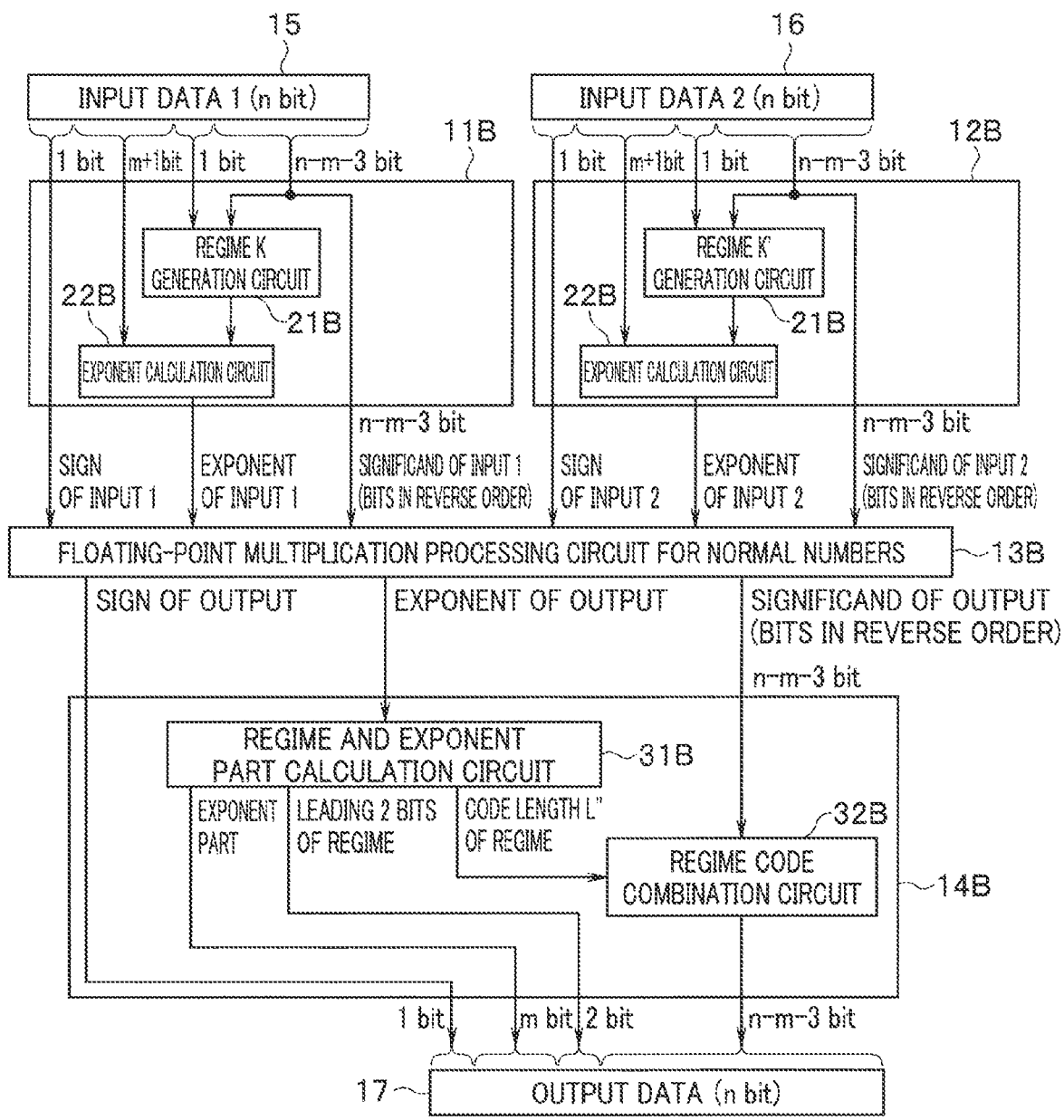
FIG. 8 is a block diagram illustrating an example of a specific configuration of an operation device according to the second embodiment.

FIG. 8 is a block diagram illustrating an example of a specific configuration of an operation device according to the second embodiment. The operation device in FIG. 8 is provided with a first decoder 11B, a second decoder 12B, an operation processing circuit 13B, and an encoder 14B. The input data 1, the input data 2, and the output data are all n-bit floating-point numbers having the data structure illustrated in FIG. 7.

The first decoder 11B and the second decoder 12B have the same configuration, and internal circuits of each are denoted with the same reference numerals. Only the first decoder 11B is described, and a description of the second decoder 12B is omitted. The first decoder 11B is provided with a K generation circuit 21B and an exponent calculation circuit 22B. Note that the value K' of the regime handled by the second decoder 12B is denoted by the prime symbol, and the code length L" of the regime handled by the encoder 14B is denoted by the double prime symbol.

The leading bit acting as the sign part of the input data 1 is outputted to the operation processing circuit 13B through the first decoder 11B.

The K generation circuit 21B receives the low (n-m-2) bits of the input data 1 excluding the sign part, the exponent part, and the leading bit of the extended exponent part, and generates the value K of the regime according to the variable-length coding rules in FIG. 6.

The exponent calculation circuit 22B calculates the exponent of the floating-point number in the ordinary format on a basis of the in-bit exponent part and the leading bit of the extended exponent part in the input data 1 and the value K received from the K generation circuit 21B, and outputs the calculated exponent to the operation processing circuit 13B.

Additionally, the first decoder 11B outputs the low (n-m-3) bits of the input data 1 to the operation processing circuit 13B.

The operation processing circuit 13B multiplies the floating-point numbers inputted from the first and second decoders 11B and 12B, and outputs the multiplication result to the encoder 14B. Note that the floating-point numbers inputted into and outputted from the operation processing circuit 13B are in the ordinary format, but differ from the IEEE 754 format and the like by having the significand bits in reverse order.

The encoder 14B is provided with a circuit 31B that calculates the regime and the exponent part (hereinafter abbreviated to the calculation circuit 31B) and a circuit 32B that combines the regime code (hereinafter abbreviated to the combination circuit 32B). The encoder 14B treats the leading bit of the data received from the operation processing circuit 13B as the leading bit of the output data.

The calculation circuit 31B receives the exponent of the operation result from the operation processing circuit 13B, and outputs the data of the low in bits as the exponent part. The calculation circuit 31B encodes the data of the remaining high bits according to the variable-length coding rules. The calculation circuit 31B outputs the high 2 bits of the encoded data as the high 2 bits of the regime code in the output data. The calculation circuit 31B outputs the code length L" of the regime to the combination circuit 32B.

The combination circuit 32B receives the significand (n-m-3) bits of the operation result from the operation processing circuit 13B. The combination circuit 32B generates data of the low (L"-2) bits of the regime code on a basis of the code length L" received from the calculation circuit 31B, combines the generated data with the received significand (n-m-3) bits, and outputs the combined result. Note that the reason why the processing of rounding (such as rounding up at 5) the significand part which was necessary in the combination circuit 32 in FIG. 4 is no longer necessary is that, from the interpretation of Expression (2), it is sufficient to simply discard the digits.

According to the second embodiment, substantially the same effects as the first embodiment are exhibited. In the second embodiment, the mask circuit 23 is unnecessary, and therefore the circuit scale and the power consumption of the operation device can be reduced. Also, because the combination circuit 32b is unnecessary in the second embodiment, the processing circuit can be simplified.

Note that with the data structure illustrated in FIG. 7, various modifications similar to the first embodiment are applicable on the condition that the least significant bit $f_v$ of the significand part and the end bit 1 of the variable-length code of the extended exponent part are adjacent to each other. In addition, any function may be used to express the exponent in terms of the value e of the exponent part and the regime value K.

Third Embodiment

Figures 9, 10:
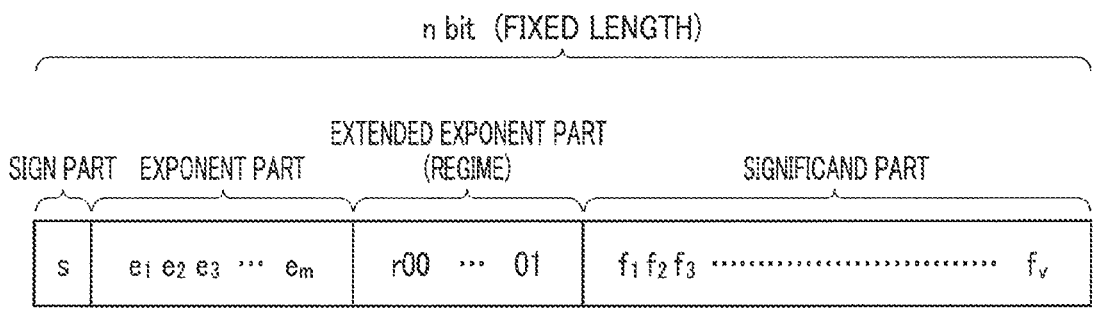
FIG. 9 is a diagram illustrating a data structure of a floating-point number according to a third embodiment.
FIG. 10 is a table illustrating an offset to an exponent indicated by a value of low (n−m−2) bits of a floating-point number according to the third embodiment, in comparison with a case of an ordinary denormal number.

FIG. 9 is a diagram illustrating a data structure of a floating-point number according to a third embodiment. In the third embodiment, the portions that differ from the first and second embodiments will be described mainly. The operation device according to the third embodiment is configured to support a plurality of different floating-point number formats.

In a case where the operation device needs to support a plurality of floating-point number formats and also needs to support a format in which the hidden bit of the significand is included in the significand part without being left out, like denormal numbers in IEEE 754, the digit position and the bit position of the significand part do not necessarily have a 1-to-1 correspondence. Consequently, a configuration that maintains a static correspondence between the digit position and the hit position of the significand part like the first and second embodiments is no longer valid. The present embodiment adopts the data structure of a floating-point number illustrated in FIG. 9 to thereby support a plurality of floating-point number formats and also support formats in which the hidden bit is included in the significand part without being left out.

The bit array of the significand part is in forward order in the data structure of FIG. 9. Otherwise, the data structure is the same as FIG. 7. Also, the variable-length coding rules of the regime used in the present embodiment are the rules illustrated in FIG. 6. The necessary condition for the data structure of a floating-point number according to the present embodiment is that the most significant bit $f_1$ of the significand part and the end bit 1 of the variable-length code of the extended exponent part are adjacent to each other.

If the data structure in FIG. 9 is adopted, the 1 expressing the end part of the extended exponent part also serves as the hidden bit of the significand. In other words, if the low (n−m−2) bits of the floating-point number are extracted, the bits are directly treated as a significand with a hidden bit (denormal number).

However, in the denormal number in FIG. 9, the relationship between the bit position of the hidden bit and the offset to the exponent is different than an ordinary denormal number.

FIG. 10 is a table illustrating the offset to an exponent indicated by the value of low (n−m−2) bits of a floating-point number according to the third embodiment, in comparison with a case of an ordinary denormal number.

In a case of an ordinary denormal number, as the 1 expressing the end part (and hidden bit) of the extended exponent part moves one digit at a time from the left end to the right, the offset to the exponent decreases 1 at a time from −1.

On the other hand, in a case of the configuration illustrated in FIG. 9, as the 1 expressing the end part of the extended exponent part moves one digit at a time from the left end to the right, the offset to the exponent is the value obtained by multiplying M and the sign $(-1)^r$ indicating whether the regime is positive or negative by the value $[r,(r+1), (r+2), \ldots]$ of increasing the flag r by 1 at a time.

Figure 11:
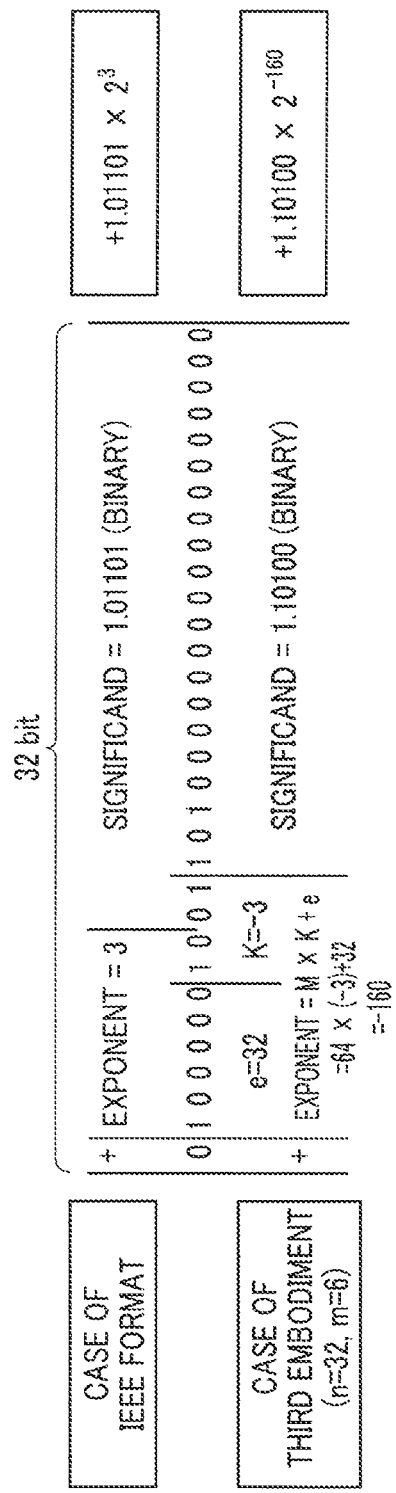
FIG. 11 is a diagram illustrating a comparison of a 32-bit numerical value expressed as a floating-point number having the data structure according to the third embodiment and as a normal floating-point number in an IEEE 754 format.

FIG. 11 is a diagram illustrating an example of a comparison of a 32-bit numerical value expressed as a floating-point number according to the third embodiment and as a normal floating-point number in the IEEE 754 format.

In a case of the numerical value example illustrated in FIG. 11, for the floating-point number in the IEEE 754 format, the sign is positive, the exponent is 3, the significand is 1.01101 (binary), and the value is $+1.01101\times2^3$.

On the other hand, in the format illustrated in FIG. 9, in a case where n=32 and m=6, the sign is positive, the exponent e is 32, the regime value K is −3, and the significand is 1.10100 (binary). Consequently, the value is $+1.10100\times2^{-160}$ In other words, in the example illustrated in FIG. 11, the extraction position of the significand part is different and the value of the significand is different between the two floating-point numbers.

Figure 12:
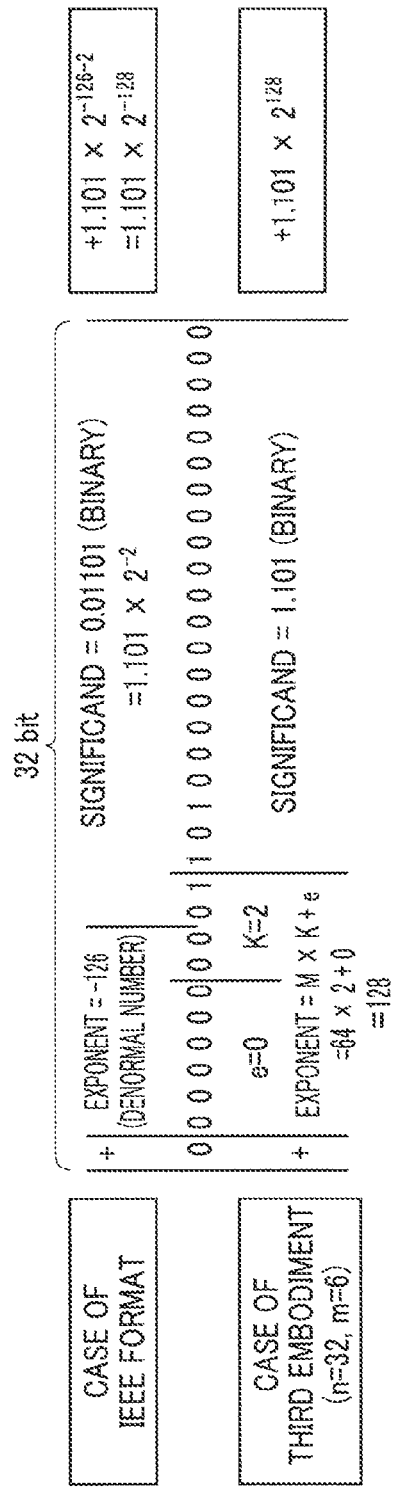
FIG. 12 is a diagram illustrating a comparison of a 32-hit numerical value expressed as a floating-point number having the data structure according to the third embodiment and as a denormal floating-point number in the IEEE 754 format.

FIG. 12 is a diagram illustrating an example of a comparison of a 32-bit numerical value expressed as a floating-point number according to the third embodiment and as a denormal floating-point number in the IEEE 754 format.

In a case of the numerical value example illustrated in FIG. 12, in the IEEE 754 format, the sign is positive, the exponent is −126, the significand is $1.101\times2^{-2}$ (binary), and the value is $+1.101\times2^{-128}$.

On the other hand, in the format illustrated in FIG. 9, for n=32 and m=6, the sign is positive, the value e of the exponent part is 0, the regime value K is 2, and the significand is 1.101 (binary). The exponent calculated from m, e, and K is 128, and therefore the value is $+1.101\times2^{128}$.

Note that the bias 128 with respect to e=0 is also calculated using the formula $(-1)^r\times M\times(r+2)$ in the Third Embodiment field corresponding to the low (n−m−2) bits "001xxxx . . . " in FIG. 10. In other words, in a case of a denormal number, the hidden bit is not left out in IEEE 754 format, either, and therefore the significand part is handled in the same way as the format illustrated in FIG. 9.

Figure 13:
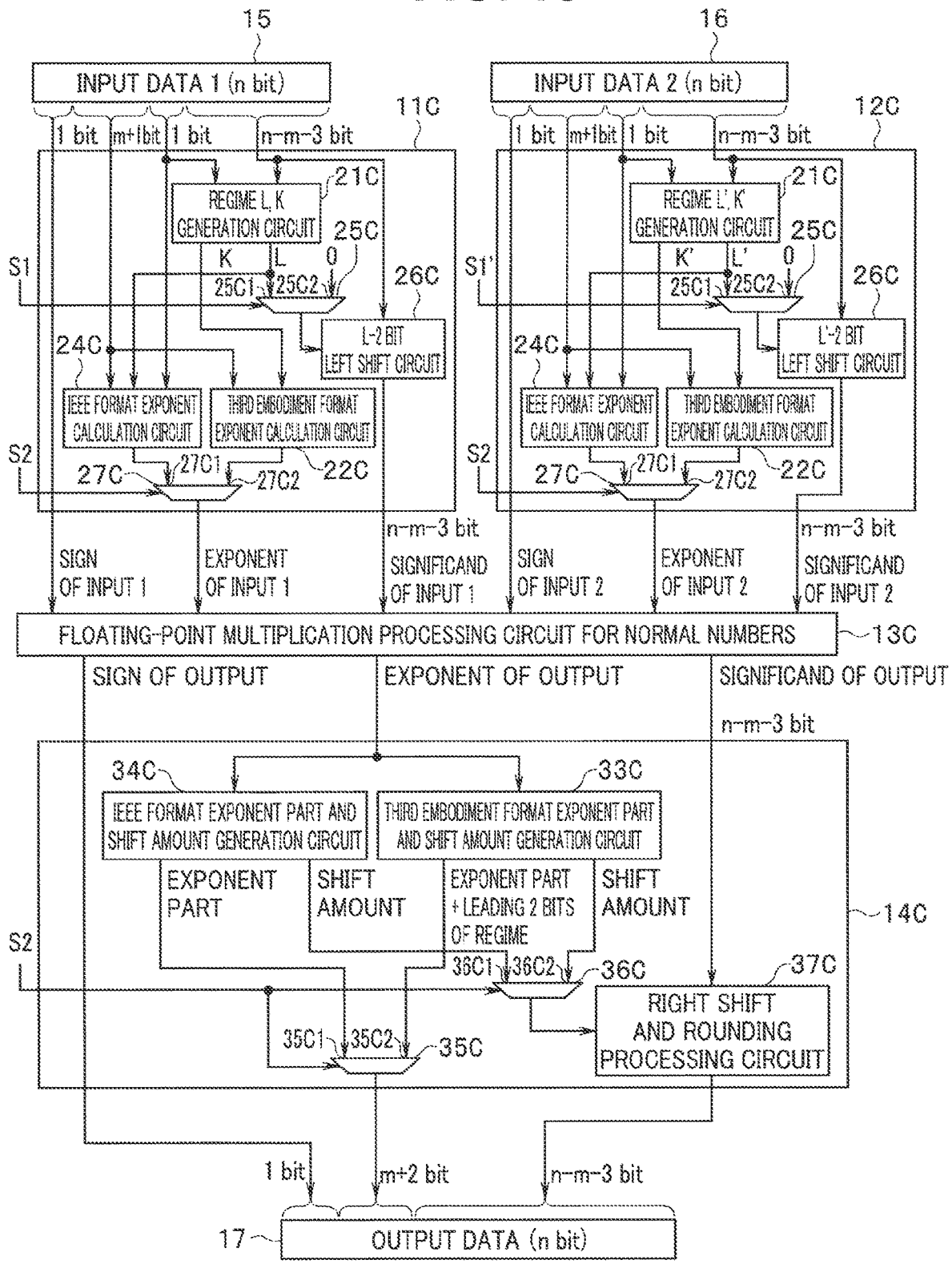
FIG. 13 is a block diagram illustrating an example of a specific configuration of an operation device according to the third embodiment.

FIG. 13 is a block diagram illustrating an example of a specific configuration of an operation device according to the present embodiment. The operation device in FIG. 13 supports both the IEEE 754 format and the format in FIG. 9.

The operation device in FIG. 13 is provided with a first decoder 11C, a second decoder 12C, an operation processing circuit 13C, and an encoder 14C.

The input data 1, the input data 2, and the output data are all n-bit floating-point numbers. The operation device in FIG. 13 has a mode for the format according to the third embodiment and a mode for the IEEE 754 format, and the mode is switched according to selection signals S1 and S2 inputted into respective selectors in the operation device.

Selection signals S1 and S1' control the selectors to select an input terminal 25C1 in a case w here the input data is in the mode of the third embodiment format or a denormal number in the IEEE 754 format. Also, the selection signal S1 controls the selectors to select an input terminal 25C2 in a case where the input data is a normal number in the IEEE 754 format.

The selection signal S2 controls the selectors to select input terminals 27C1, 35C1, and 36C1 in a case where the input data is in the mode of the IEEE 754 format, and to select input terminals 27C2, 35C2, and 36C2 in a case where the input data is in the mode of the third embodiment format.

The first decoder 11C and the second decoder 12C have the same configuration, and internal circuits of each are denoted with the same reference numerals. Only the first decoder 11C is described, and a description of the second decoder 12C is omitted.

The first decoder 11C is provided with an LK generation circuit 21C, an exponent calculation circuit 22C, an exponent calculation circuit 24C, a selector 25C, a left shift circuit 26C, and a selector 27C. Note that the code length L' and value K' of the regime handled by the second decoder 12C are denoted by the prime symbol, and the code length L" of the regime handled by the encoder 14C is denoted by the double prime symbol.

The leading bit acting as the sign part of the input data 1 is outputted to the operation processing circuit 13C through the first decoder 11C.

The LK generation circuit 21C receives the low (n-m-2) bits of the input data 1, and generates the code length L and value K of the regime.

The exponent calculation circuit 22C calculates the exponent of the floating-point number in the ordinary format on a basis of the m-bit exponent part and the leading bit of the extended exponent part in the input data 1 and the value K received from the LK generation circuit 21C, and outputs the calculated exponent to the selector 27C.

The exponent calculation circuit 24C calculates the exponent on a basis of the (m+2) bits following the bit of the sign part in the input data 1 and the code length L of the regime received from the LK generation circuit 21C, and outputs the calculated exponent to the selector 27C.

The selector 27C selects the input terminal 27C1 connected to the exponent calculation circuit 24C or the input terminal 27C2 connected to the exponent calculation circuit 22C according to the selection signal S2, and outputs the selected input terminal to the operation processing circuit 13C as the exponent.

The selector 25C selects and outputs the input terminal 25C1 connected to the input (code length L) from the LK generation circuit 21C or the input terminal 25C2 connected to the input (0) according to the selection signal S1.

The left shift circuit 26C receives the low (n-m-3) bits of the input data 1, and shifts the data (L-2) bits to the left in a case of receiving the code length L from the selector 25C, or does not perform a left shift in a case of receiving 0 from the selector 25C. The left shift circuit 26C outputs the processed (n-m-3) bits to the operation processing circuit 13C as the significand.

The operation processing circuit 13C multiplies the floating-point numbers inputted from the first and second decoders 11C and 12C', and outputs the multiplication result to the encoder 14C.

The encoder 14C is provided with a circuit 33C that generates the exponent part and the shift amount of the format according to the third embodiment (hereinafter abbreviated to the generation circuit 33C), a circuit 34C that generates the exponent part and the shift amount of the IEEE 754 format (hereinafter abbreviated to the generation circuit 34C), a selector 35C, a selector 36C, and a circuit that performs a right shift and a rounding process (hereinafter abbreviated to the right shift circuit 37C'). The encoder 14C treats the leading bit of the data received from the operation processing circuit 13C as the leading bit of the output data.

The generation circuit 33C receives the exponent of the operation result from the operation processing circuit 13C, and treats the data of the low m bits as the exponent part. The generation circuit 33C encodes the data of the remaining high bits according to the variable-length coding rules. The generation circuit 33C treats the high 2 bits of the encoded data as the high 2 bits of the regime code in the output data. The generation circuit 33C outputs the exponent part and the high 2 bits of the regime to the selector 35C The generation circuit 33C calculates the shift amount (L"-2) on a basis of the code length L" of the regime, and outputs the calculated shift amount to the selector 36C.

The generation circuit 34C receives the exponent of the operation result from the operation processing circuit 13C. In a case where the operation result is a normal number, the generation circuit 34C generates the exponent part in the IEEE 754 format from the received exponent, and sets the shift amount to 0. Also, in a case where the operation result is a denormal number, the generation circuit 34C sets all bits of the exponent part in the IEEE 754 format to 0, and calculates a shift amount for right-shifting the significand according to the received exponent. The generation circuit 34C outputs the exponent part to the selector 35C, and outputs the shift amount to the selector 36C.

The selector 35C selects the input terminal 35C1 connected to the generation circuit 34C or the input terminal 35C2 connected to the generation circuit 33C according to the selection signal S2, and outputs the selected input terminal as the data of the (m+2) bits following the leading bit of the output data.

The selector 36C selects the input terminal 36C1 connected to the input (shift amount) from the generation circuit 34C or the input terminal 36C2 connected to the input (shift amount) from the generation circuit 33C according to the selection signal S2, and outputs the selected input terminal to the right shift circuit 37C.

The right shift circuit 37C receives the significand (n-m-3) bits of the operation result from the operation processing circuit 13C, and performs a rounding process. Additionally, the right shift circuit 37C performs a right shift according to the shift amount received from the selector 36C, and outputs the result as the data of the low (n-m-3) bits of the output data.

Note that FIG. 10 merely illustrates one example of the offset to the exponent applicable to the third embodiment, and the configuration is not limited to such an example. The basic difference with respect to the offset to the exponent between an ordinary denormal number and the format according to the third embodiment is either of the following.
1) When the hidden bit is moved 1 bit lower, the change in the exponent is −1 for an ordinary denormal number, but different depending on whether r is positive or negative in the format according to the third embodiment, namely M in a case of r=0 or −M in a case of r=1. However, although an example of changing by M is illustrated in FIG. 10, the exponent may also change by a natural number more commonly.
2) When the hidden bit is moved 1 bit, the absolute value of the amount of change in the exponent is 1 for an ordinary denormal number, but 2 or more in the format according to the third embodiment. As indicated in Equation (1a), in the example illustrated in FIG. 10, M is given as a power of 2. However, M is not limited to a power of 2 insofar as M is equal to or greater than 2.

As long as either of the above conditions holds, the relationship between the expressed exponent, and the value e of the exponent part and the position of the hidden bit may be given by any function.

According to the third embodiment, an operation device capable of performing processing by accepting floating-point numbers in either the format according to the third embodiment or the IEEE 754 format as input data is obtained. Furthermore, operation processing is possible even in a case where the input data is a denormal number in the IEEE 754 formal.

In addition, the shift circuit can be shared in common between denormal numbers in the IEEE 754 format and floating-point numbers in the format according to the third embodiment. With this configuration, the circuit scale and power consumption of the operation device can be reduced compared to a case of providing separate shift circuits corresponding to the processing for each format.

Fourth Embodiment

Figures 14, 15:
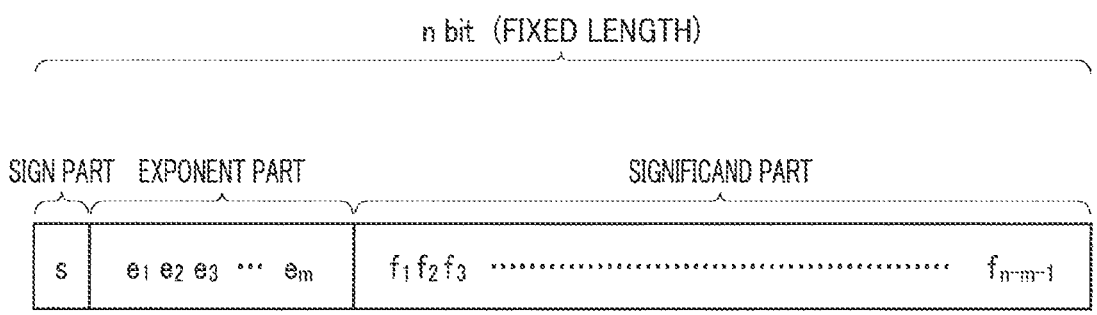
FIG. 14 is a diagram illustrating a data structure of a floating-point number according to a fourth embodiment.
FIG. 15 is a table illustrating a data structure of a significand part of a denormal number according to the fourth embodiment, in comparison with a data structure of a significand part of an ordinary denormal number.

FIG. 14 is a diagram illustrating a data structure of a floating-point number according to a fourth embodiment. In the fourth embodiment, the portions that differ from the first to third embodiments will be described mainly. A floating-point number according to the present embodiment has a fixed length of n bits (where n is a positive integer), in which the leading bit is the sign part, the next m bits are the exponent part, and the following (n-m-1) bits are the significand part.

FIG. 15 is a table illustrating the significand part of a denormal number according to the fourth embodiment in comparison with the significand part of an ordinary-denormal number.

Even with a floating-point number format containing a sign part, an exponent part, and a significand part of fixed length like the IEEE 754 format, a process of shifting the significand part is necessary to support denormal numbers. Accordingly, the present embodiment locks the relationship between the digit position and the bit position of the significand to make a shift process unnecessary in such a floating-point number format, even in denormal number conditions (that is, when the exponent part is a minimum value).

As illustrated in FIG. 15, in an ordinary denormal number, a number of 0s corresponding to the reduction of the exponent and the following 1 (expressing the hidden bit) are inserted from a more significant side of the significand part.

On the other hand, in the fourth embodiment, the number of 0s corresponding to the reduction of the exponent and the following 1 (expressing the boundary of the significant digits of the significand) are inserted from a less significant side of the significand part. Hereinafter, the bit with a value of 1 expressing the boundary of the significant digits of the significand is referred to as a boundary bit.

Note that the order in which "xxx . . . x" is expressed is the same in both the ordinary denormal number field and the fourth embodiment field.

Figure 16:
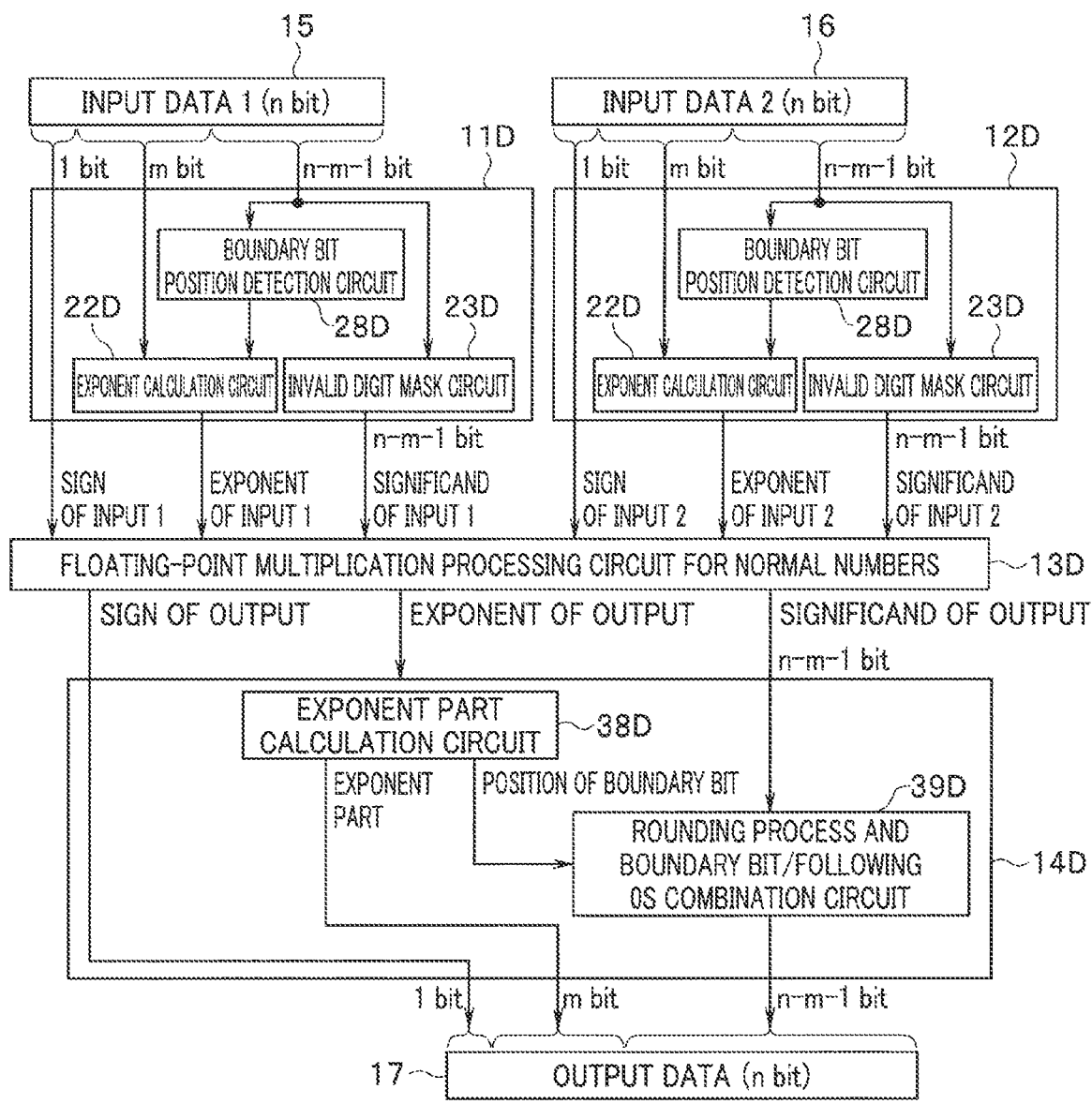
FIG. 16 is a block diagram illustrating an example of a specific configuration of an operation device according to the fourth embodiment.

FIG. 16 is a block diagram illustrating an example of a specific configuration of an operation device according to the fourth embodiment. The operation device in FIG. 16 is provided with a first decoder 11D, a second decoder 12D, an operation processing circuit 13D, and an encoder 14D. The input data 1, the input data 2, and the output data are all n-bit floating-point numbers having the data structure illustrated in FIG. 14.

The first and second decoders 11D and 12D decode and convert a floating-point number having the data structure in FIG. 14 to output a floating-point number in the ordinary format.

The operation processing circuit 13D multiplies the input data 1 and 2 decoded into the ordinary format, and outputs the multiplication result in the ordinary format.

The encoder 14D encodes and converts a floating-point number in the ordinary format to output a floating-point number having the data structure in FIG. 14.

The first decoder 11D and the second decoder 12D have the same configuration, and internal circuits of each are denoted with the same reference numerals. Only the first decoder 11D is described, and a description of the second decoder 12D is omitted.

The first decoder 11D is provided with a boundary detection circuit 28D, an exponent calculation circuit 22D, and an invalid digit mask circuit 23D (hereinafter abbreviated to the mask circuit 23D).

The leading bit acting as the sign part of the input data 1 is outputted to the operation processing circuit 13D through the first decoder 11D.

The boundary detection circuit 28D receives the low (n-m-1) bits of the input data 1 excluding the sign part and the exponent part, and detects the position of the boundary bit.

The exponent calculation circuit 22D calculates the exponent of the floating-point number in the ordinary format on a basis of the value e of the m-bit exponent part in the input data 1 and the position of the boundary bit received from the boundary detection circuit 28D, and outputs the calculated exponent to the operation processing circuit 13D.

The mask circuit 23D receives the low (n-m-1) bits of the input data 1, masks the invalid digits, and outputs the significand to the operation processing circuit 13D. The invalid digits are the digits of the successive 0s and the following boundary bit 1 inserted from the less significant side of the significand part.

The operation processing circuit 13D multiplies the floating-point number inputted from the first decoder 11D and the floating-point number inputted from the second decoder 12D, and outputs the floating-point number of the multiplication result to the encoder 14D.

The encoder 14D is provided with a circuit 38D that calculates the exponent part (hereinafter abbreviated to the calculation circuit 38D) and a circuit 39D that performs a rounding process and combines the boundary bit and the following 0s (hereinafter abbreviated to the combination circuit 39D).

The encoder 14D treats the leading bit of the data received from the operation processing circuit 13D as the leading bit of the output data.

The calculation circuit 38D receives the exponent of the operation result from the operation processing circuit 13D, and generates the m-bit exponent part and the position of the boundary bit. At this point, in a case of a denormal number, all bits of the exponent part are set to 0, and the digit position corresponding to the bias of the exponent is treated as the position of the boundary bit. Also, in a case of a normal number, the exponent of the operation result is treated as the value of the exponent part, and the position of the boundary bit is treated as 0, for example. The calculation circuit 38D outputs the calculated m-bit exponent part as a part of the output data, and outputs the position of the boundary bit to the combination circuit 39D.

The combination circuit 39D receives the significand (n-m-1) bits of the operation result from the operation processing circuit 13D, and performs a process of rounding (such as rounding up at 5) a digit of the significand on a basis of the position of the boundary bit received from the calculation circuit 38D. In a case where the position of the boundary bit is not 0, the combination circuit 39D combines the boundary bit "1" and the following 0s to generate a significand part like those illustrated in the fourth embodiment field in FIG. 15. The combination circuit 39D outputs the processed (n-m-1) bits as the significand part of the output data.

Note that in FIG. 16, the invalid digit mask circuit mask circuit 23D is provided in the first decoder 11D and the second decoder 12D, and the combination circuit 39D in the encoder 14D performs the rounding process, but if the value of the significand part is interpreted in the same way as Expression (2) in the second embodiment, the invalid digit mask circuit 23D and the rounding process by the combination circuit 39D can be omitted.

According to the fourth embodiment, substantially the same effects as the first to third embodiments are exhibited, and in addition, because the relationship between the digit position and the bit position of the significand is locked, operations on denormal numbers can be processed without the need for a shift process. Consequently, the circuit scale and power consumption of the operation device can be reduced.

Also, by applying the interpretation of Expression (2) to the value of the significand part, the invalid digit mask circuit 23D and the rounding process by the combination circuit 39D can be omitted. With this arrangement, the circuit scale and power consumption of the operation device can be reduced further.

Note that the embodiments illustrate an example in which the operation processing circuit 13 is a floating-point multiplication processing circuit that operates on normal numbers, but an operation device according to the embodiments is not limited to specific operation processing, and is also applicable to other numerical operation processes such as addition, division, and multiply-accumulate operations.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A decoder that converts a data structure of a floating-point number from a first data structure to a second data structure, comprising:
   an input configured to receive the floating-point number of the first data structure;
   the first data structure comprising a first sign part, a first exponent part, and a set of an extended exponent part and a first significand part, the first sign part, the first exponent part, and the set being arrayed in any order, wherein:
   the first sign part includes a sign of the floating-point number, and has a fixed code length;
   the first exponent part includes part of an exponent of the floating-point number and has a fixed code length;
   the set has a fixed code length, and is configured such that an end bit of the extended exponent part and a least significant bit of the first significand part are adjacent to each other;
   the extended exponent part includes a code obtained by encoding another part of the exponent of the floating-point number using variable-length coding, and has a variable code length;
   the first significand part includes a significand of the floating-point number, and has a variable code length such that a total of the code length of the extended exponent part, and the code length of the first significand part is fixed;
   the decoder is configured to receive data of the first sign part and output the data of the first sign part as data of a second sign part in the second data structure;
   the decoder further comprising:
      a generation circuit configured to receive data of the set and generate and output a value of the extended exponent part;
      the generation circuit further generates data of the code length of the extended exponent part;
      an invalid digit mask circuit configured to receive the data of the set and the data of the code length of the extended exponent part generated by the generation circuit, mask an invalid digit in the data of the set, and output the data of the set in which the invalid digit is masked as the second significand part, and
      an exponent calculation circuit configured to receive data of the first exponent part and the value of the extended exponent part generated by the generation circuit, and calculate and output data of a second exponent part in the second data structure;
   the decoder thereby outputting data of the second data structure comprising the second sign part, the second exponent part, and a second significand part, wherein:
   the second exponent part includes the exponent of the floating-point number, and has a fixed code length,
   the second significand part includes the significand of the floating-point number, and has a fixed code length; and
   the floating-point number having the second data structure is configured such that a correspondence relationship between a digit position and a bit position of the second exponent part and the second significand part is fixed, excluding a denormal number.

2. The decoder according to claim 1, wherein
   the end bit of the extended exponent part is 1,
   the extended exponent part has a low bit pattern containing successive 0s and the 1 of the end bit, and
   the value of the extended exponent part is obtained on a basis of a number of the successive 0s in the low bit pattern.

3. The decoder according to claim 2, wherein the decoder receives the data of the set and outputs part of the data of the set as the second significand part.

4. The decoder according to claim 1, wherein
   the end bit of the extended exponent part is 0,
   the extended exponent part has a low bit pattern containing successive 1s and the 0 of the end bit, and
   the value of the extended exponent part is obtained on a basis of a number of the successive 1s in the low bit pattern.

5. An encoder that converts a data structure of a floating-point number from a second data structure to a first data structure, comprising:
   an input configured to receive the floating-point number of the second data structure;
   the second data structure comprising a second sign part, a second exponent part, and a second significand part, wherein:
   the second sign part includes a sign of the floating-point number, and has a fixed code length;
   the second exponent part includes an exponent of the floating-point number, and has a fixed code length;
   the second significand part includes a significand of the floating-point number, and has a fixed code length; and
   the floating-point number having the second data structure is configured such that a correspondence relationship between a digit position and a bit position of the second exponent part and the second significand part is fixed, excluding a denormal number;
   wherein the encoder is configured to receive data of the second sign part and output the data of the second sign part as data of a first sign part in the first data structure; and
   the encoder further comprising a calculation circuit and a combination circuit to output further data of the first data structure;
   the first data structure comprising the first sign part, a first exponent part, and a set of an extended exponent part and a first significand part, the first sign part, the first exponent part, and the set being arrayed in any order, wherein:

the first sign part includes a sign of the floating-point number, and has a fixed code length;

the first exponent part includes part of an exponent of the floating-point number and has a fixed code length;

the set has a fixed code length, and is configured such that an end bit of the extended exponent part and a least significant bit of the first significand part are adjacent to each other;

the extended exponent part includes a code obtained by encoding another part of the exponent of the floating-point number using variable-length coding, and has a variable code length; and the first significand part includes a significand of the floating-point number, and has a variable code length such that a total of the code length of the extended exponent part and the code length of the first significand part is fixed, the calculation circuit configured to receive data of the second exponent part, output part of the data of the second exponent part as data of the first exponent part, and calculate part of data of the extended exponent part and data of the code length of the extended exponent part from another part of the data of the second exponent part; and the combination circuit configured to receive the data of the code length of the extended exponent part, the part of the data of the extended exponent part being calculated by the calculation circuit, and the data of the second significand part, generate another part of the data of the extended exponent part and data of the first significand part, and output the generated part of the data of the extended exponent part and the generated data of the first significand part.

6. The encoder according to claim 5, wherein the combination circuit further performs a rounding process on a digit in the data of the second significand part, the digit being to be overwritten by a bit pattern of the code of the extended exponent part.

7. The encoder according to claim 5, wherein the end bit of the extended exponent part is 1, the extended exponent part has a low bit pattern containing successive 0s and the 1 of the end bit, and a value of the extended exponent part is obtained on a basis of a number of the successive 0s in the low bit pattern.

8. The encoder according to claim 5, wherein the end bit of the extended exponent part is 0, the extended exponent part has a low bit pattern containing successive 1s and the 0 of the end bit, and a value of the extended exponent part is obtained on a basis of a number of the successive 1s in the low bit pattern.

9. A decoder that converts a data structure of a floating-point number from a first data structure to a second data structure, comprising:

an input configured to receive the floating-point number of the first data structure;

the first data structure comprising a first sign part, a first exponent part, and a set of an extended exponent part and a first significand part, wherein:

the first sign part includes a sign of the floating-point number, and has a fixed code length, the first exponent part includes part of an exponent of the floating-point number, and has a fixed code length;

the set has a fixed code length, and is configured such that an end bit of the extended exponent part and a most significant bit of the first significand part are directly adjacent to each other;

the extended exponent part includes a code obtained by encoding another part of the exponent of the floating-point number using variable-length coding, and has a variable code length; and the first significand part includes a significand of the floating-point number, and has a variable code length such that a total of the code length of the extended exponent part and the code length of the first significand part is fixed, wherein the decoder is configured to receive data of the first sign part and output the data of the first sign part as data of a second sign part in the second data structure;

the decoder further comprising:

a generation circuit configured to receive data of the set, and generate a value of the extended exponent part and data of the code length of the extended exponent part;

an exponent calculation circuit configured to receive data of the first exponent part and the value of the extended exponent part generated by the generation circuit, and calculate and output data of a second exponent part in the second data structure; and a shift circuit configured to receive the data of the set and the data of the code length of the extended exponent part generated by the generation circuit, shift the data of the set according to the data of the code length of the extended exponent part, and output the shifted data as a second significand part in the second data structure;

the decoder thereby outputting data of the second data structure comprising the second sign part, the second exponent part, and the second significand part, wherein:

the second exponent part includes the exponent of the floating-point number, and has a fixed code length;

the second significand part includes the significand of the floating-point number, and has a fixed code length; and the floating-point number having the second data structure is configured such that a correspondence relationship between a digit position and a bit position of the second exponent part and the second significand part is fixed, excluding a denormal number.

10. The decoder according to claim 9, wherein the end bit of the extended exponent part is 1, the extended exponent part has a low bit pattern containing successive 0s and the 1 of the end bit, and the value of the extended exponent part is obtained on a basis of a number of the successive 0s in the low bit pattern.

11. The decoder according to claim 9, wherein the end bit of the extended exponent part is 0, the extended exponent part has a low bit pattern containing successive 1s and the 0 of the end bit, and the value of the extended exponent part is obtained on a basis of a number of the successive 1s in the low bit pattern.

12. An encoder that converts a data structure of a floating-point number from a second data structure to a first data structure, comprising:

an input configured to receive the floating-point number of the second data structure;

the second data structure comprising a second sign part, a second exponent part, and a second significand part, wherein:

the second sign part includes a sign of the floating-point number, and has a fixed code length;

the second exponent part includes an exponent of the floating-point number, and has a fixed code length;

the second significand part includes a significand of the floating-point number, and has a fixed code length; and the floating-point number having the second data structure is configured such that a correspondence relationship between a digit position and a bit position of the second exponent part and the second significand part is fixed, excluding a denormal number;

wherein the encoder is configured to receive data of the second sign part and output the data of the second sign part as data of a first sign part in the first data structure; and the encoder further comprising a generation circuit and a shift circuit to output further data of the first data structure;

the first data structure comprising the first sign part, a first exponent part, and a set of an extended exponent part and a first significand part, wherein:

the first sign part includes a sign of the floating-point number, and has a fixed code length;

the first exponent part includes part of an exponent of the floating-point number, and has a fixed code length;

the set has a fixed code length, and is configured such that an end bit of the extended exponent part and a most significant bit of the first significand part are adjacent to each other;

the extended exponent part includes a code obtained by encoding another part of the exponent of the floating-point number using variable-length coding, and has a variable code length; and the first significand part includes a significand of the floating-point number, and has a variable code length such that a total of the code length of the extended exponent part and the code length of the first significand part is fixed, the generation circuit configured to receive data of the second exponent part, output part of the data of the second exponent part as data of the first exponent part, generate leading 2 bits of data of the extended exponent part and a shift amount from another part of the data of the second exponent part, and output the generated leading 2 bits and the shift amount; and the shift circuit configured to receive the shift amount generated by the generation circuit and data of the second significand part, perform a rounding process on the data of the second significand part, perform a shift process, according to the shift amount, on the rounded data of the second significand part, and output the shifted data, as a part excluding the leading 2 bits of the data of the extended exponent part and as data of the first significand part.

13. The encoder according to claim 12, wherein
the end bit of the extended exponent part is 1,
the extended exponent part has a low bit pattern containing successive 0s and the 1 of the end bit, and
a value of the extended exponent part is obtained on a basis of a number of the successive 0s in the low bit pattern.

14. The encoder according to claim 12, wherein
the end bit of the extended exponent part is 0,
the extended exponent part has a low bit pattern containing successive 1s and the 0 of the end bit, and
a value of the extended exponent part is obtained on a basis of a number of the successive 1s in the low bit pattern.

15. A decoder that converts a data structure of a floating-point number from a first data structure to a second data structure, comprising:

an input configured to receive the floating-point number of the first data structure;

the first data structure comprising a first sign part, a first exponent part, and a first significand part, wherein:

the first sign part includes a sign of the floating-point number, and has a fixed code length;

the first exponent part includes part or all of an exponent of the floating-point number, and has a fixed code length;

the first significand part includes a significand of the floating-point number, and has a fixed code length, the first significand part including, a significant digit of the significand of the floating-point number stored in a high bit, and a bit pattern lower than the significant digit of the significand of the floating-point number, the bit pattern containing a boundary bit of 1 expressing a boundary of the significant digit of the significand of the floating-point number and successive 0s to a lowest bit of the first significand part; and the exponent of the floating-point number is obtained on a basis of part or all of the exponent included in the first exponent part and a number of the successive 0s in the bit pattern, the decoder configured to receive data of the first sign part and output the data of the first sign part as data of a second sign part in the second data structure; and the decoder further comprising:

a boundary detection circuit configured to receive data of the first significand part and detect a position of the boundary bit;

an exponent calculation circuit configured to calculate the exponent of the floating-point number on a basis of data of the first exponent part and the position of the boundary bit detected by the boundary detection circuit, and output the calculated exponent as data of a second exponent part in the second data structure; and a mask circuit configured to receive the data of the first significand part, mask an invalid digit other than the significant digit of the significand of the floating-point number, and output the significand in which the invalid digit is masked as data of a second significand part in the second data structure;

the decoder thereby outputting data of the second data structure comprising the second sign part, the second exponent part, and the second significand part, wherein:

the second exponent part includes the exponent of the floating-point number, and has a fixed code length;

the second significand part includes the significand of the floating-point number, and has a fixed code length; and the floating-point number having the second data structure is configured such that a correspondence relationship between a digit position and a bit position of the second exponent part and the second significand part is fixed, excluding a denormal number.

16. An encoder that converts a data structure of a floating-point number from a second data structure to a first data structure, comprising:

an input configured to receive the floating-point number of the second data structure;

the second data structure comprising a second sign part, a second exponent part, and a second significand part, wherein:
the second sign part includes a sign of the floating-point number, and has a fixed code length;
the second exponent part includes an exponent of the floating-point number, and has a fixed code length;
the second significand part includes a significand of the floating-point number, and has a fixed code length;
the floating-point number having the second data structure is configured such that a correspondence relationship between a digit position and a bit position of the second exponent part and the second significand part is fixed, excluding a denormal number;
wherein the encoder is configured to receive data of the second sign part and output the data of the second sign part as data of a first sign part in the first data structure, and
the encoder further comprising a calculation circuit and a combination circuit to output further data of the first data structure;
the first data structure comprising the first sign part, a first exponent part, and a first significand part, wherein:
the first sign part includes a sign of the floating-point number, and has a fixed code length;
the first exponent part includes part or all of an exponent of the floating-point number, and has a fixed code length;
the first significand part includes a significand of the floating-point number, and has a fixed code length,
the first significand part including, a significand digit of the significand of the floating-point number stored in a high bit, and
a bit pattern lower than the significant digit of the significand of the floating-point number, the bit pattern containing a boundary bit of 1 expressing a boundary of the significant digit of the significand of the floating-point number and successive 0s to a lowest bit of the first significand part; and
the exponent of the floating-point number is obtained on a basis of part or all of the exponent included in the first exponent part and a number of the successive 0s in the bit pattern,
the calculation circuit configured to receive data of the second exponent part, generate the first exponent part and a position of the boundary bit, and output the generated first exponent part and the position of the boundary bit; and
the combination circuit configured to receive data of the second significand part and the position of the boundary bit generated by the calculation circuit, perform a rounding process on a digit of the significand on a basis of the position of the boundary bit, generate the first significand part by combining 1 of the boundary bit and 0s following the boundary bit in a case where the position of the boundary bit is not 0, and output the generated first significand part.

* * * * *